United States Patent
Masuda et al.

(10) Patent No.: US 9,816,200 B2
(45) Date of Patent: Nov. 14, 2017

(54) SILICON CARBIDE POWDER AND METHOD FOR PRODUCING SILICON CARBIDE SINGLE CRYSTAL

(71) Applicants: TAIHEIYO CEMENT CORPORATION, Tokyo (JP); NATIONAL INSTITUTE OF ADVANCED INDUSTRIAL SCIENCE AND TECHNOLOGY, Tokyo (JP)

(72) Inventors: Kenta Masuda, Chiba (JP); Kouki Ichitsubo, Chiba (JP); Masakazu Suzuki, Chiba (JP); Kiyoshi Nonaka, Chiba (JP); Tomohisa Kato, Ibaraki (JP); Hideaki Tanaka, Kagoshima (JP)

(73) Assignees: TAIHEIYO CEMENT CORPORATION, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/908,307

(22) PCT Filed: Nov. 27, 2013

(86) PCT No.: PCT/JP2013/081886
§ 371 (c)(1),
(2) Date: Jan. 28, 2016

(87) PCT Pub. No.: WO2015/015662
PCT Pub. Date: Feb. 5, 2015

(65) Prior Publication Data
US 2016/0160386 A1    Jun. 9, 2016

(30) Foreign Application Priority Data
Jul. 31, 2013    (JP) .................................. 2013-158838

(51) Int. Cl.
*C30B 23/00*   (2006.01)
*C30B 23/02*   (2006.01)
(Continued)

(52) U.S. Cl.
CPC ............ *C30B 23/025* (2013.01); *C01B 31/36* (2013.01); *C01B 32/956* (2017.08); *C30B 23/00* (2013.01);
(Continued)

(58) Field of Classification Search
CPC .......... C30B 29/36; C30B 23/00; C01B 31/36
See application file for complete search history.

(56) References Cited

U.S. PATENT DOCUMENTS

2011/0308449 A1* 12/2011 Katsuno ................ C30B 23/005
                                                                 117/84
2013/0266810 A1* 10/2013 Katou ..................... C01B 31/36
                                                                 428/402

FOREIGN PATENT DOCUMENTS

JP    07-157307 A    6/1995
JP    2005-239496 A  9/2005
(Continued)

OTHER PUBLICATIONS

International Search Report of the International Searching Authority dated Mar. 11, 2014 for the corresponding international application No. PCT/JP2013/081886 (and English translation).
(Continued)

*Primary Examiner* — Matthew Song
(74) *Attorney, Agent, or Firm* — Posz Law Group, PLC

(57) ABSTRACT

A silicon carbide powder which, when used as a raw material in a sublimation recrystallization method, enables improvement in productivity of a silicon carbide single crystal by exhibiting a high sublimation rate and allowing a small amount of silicon carbide to remain without being
(Continued)

sublimated, and enables an increase in size of the silicon carbide single crystal (for example, a single crystal wafer). The silicon carbide powder has a Blaine specific surface area of from 250 $cm^2/g$ to 1,000 $cm^2/g$ and a ratio of a silicon carbide powder having a particle size of more than 0.70 mm and 3.00 mm or less of 50 vol % or more with respect to a total amount of the silicon carbide powder. When a silicon carbide powder accommodated in a crucible is heated to be sublimated, a silicon carbide single crystal is formed on a seed crystal provided on an undersurface of a lid.

10 Claims, 1 Drawing Sheet

(51) Int. Cl.
  *C01B 31/36* (2006.01)
  *C30B 29/36* (2006.01)
  *C01B 32/956* (2017.01)

(52) U.S. Cl.
  CPC .......... *C30B 29/36* (2013.01); *C01P 2004/50* (2013.01); *C01P 2004/60* (2013.01); *C01P 2004/61* (2013.01); *C01P 2004/62* (2013.01); *C01P 2006/12* (2013.01)

(56) References Cited

FOREIGN PATENT DOCUMENTS

| | | | |
|---|---|---|---|
| JP | 2007-223867 A | 9/2007 | |
| JP | 2007-284306 A | 11/2007 | |
| JP | 2012-101996 A | 5/2012 | |
| JP | WO 2012067011 A1 * | 5/2012 | ............ C01B 31/36 |
| JP | 2013-112541 A | 6/2013 | |

OTHER PUBLICATIONS

International Preliminary Report on Patentability dated Feb. 2, 2016 for the corresponding International application No. PCT/JP2013/081886 (and English translation).

* cited by examiner

100μm

SILICON CARBIDE POWDER AND METHOD FOR PRODUCING SILICON CARBIDE SINGLE CRYSTAL

CROSS REFERENCE TO RELATED APPLICATIONS

The present disclosure is a U.S. national stage application of PCT/JP2013/081886 filed on Nov. 27, 2013, and is based on Japanese Patent Application No. 2013-158838 filed on Jul. 31, 2013, the disclosures of which are incorporated herein by reference.

TECHNICAL FIELD

The present invention relates to a silicon carbide powder, and a method of producing a silicon carbide single crystal using the silicon carbide powder.

BACKGROUND ART

Silicon carbide (SiC) has hitherto been widely used as industrial materials, such as polishing materials (i.e. grinding materials), ceramics sintered bodies, and conductive materials. In particular, silicon carbide has recently attracted attention as a raw material of a single crystal wafer used for a power semiconductor or the like under social backgrounds such as increased energy conservation awareness and expectations for utilization of natural renewable energy resulting from abandonment or reduction of nuclear power generation.

As a method of producing a silicon carbide single crystal, there has been known a sublimation recrystallization method (i.e. modified Lely method) involving sublimating a silicon carbide powder serving as a raw material under a high temperature condition of 2,000° C. or more, to thereby yield a silicon carbide single crystal on a silicon carbide seed crystal.

As the raw material to be used in the sublimation recrystallization method, in Patent Literature 1, there is disclosed a silicon carbide raw material for growing a silicon carbide single crystal, which is a pulverized material of one or both of a silicon carbide single crystal and a silicon carbide poiycrystai grown by the sublimation recrystallization method. The silicon carbide raw material for growing a silicon carbide single crystal is used as a raw material for the second (i.e. next) growth of a silicon carbide single crystal. By conducting the second growth, the concentration of impurities in the silicon carbide single crystal is significantly reduced.

In Patent Literature 2, there is disclosed a silicon carbide powder for producing a silicon carbide single crystal, having an average particle diameter of from 100 μm or more and 700 μm or less and a specific surface area of from 0.05 m²/g or more and 0.30 m²/g or less. The powder exhibits a high and stable sublimation rate in growing the single crystal by the sublimation recrystallization method.

CITATION LIST

Patent Literature

[Patent Literature 1] JP 2005-239496 A
[Patent Literature 2] JP 2012-101996 A.

SUMMARY OF INVENTION

Technical Problem

An object of the present invention is to provide a silicon carbide powder which, when used as a raw material in a sublimation recrystallization method, enables an improvement in productivity of a silicon carbide single crystal by virtue of exhibiting a high sublimation rate and allowing a small amount of silicon carbide to remain without being sublimated, and enables an increase in size of the silicon carbide single crystal (for example, a single crystal wafer).

Solution to Problem

The inventors of the present invention have made extensive investigations for achieving the above-mentioned object. As a result, the inventors have found that the object can be achieved by a silicon carbide powder having a Blaine specific surface area falling within a specific range and a specific particle size distribution. Thus, the present invention has been completed.

That is, the present invention provides the following items [1] to [6].

[1] A silicon carbide powder, having a Blaine specific surface area of from 250 cm²/g to 1,000 cm²/g and having a ratio of a silicon carbide powder having a particle size of more than 0.70 mm and 3.00 mm or less of 50 vol % or more with respect to a total amount of the silicon carbide powder.

[2] The silicon carbide powder according to the above-mentioned item [1], in which the silicon carbide powder includes (i.e. is constituted by) aggregated particles (i.e. particles each being formed by aggregation) of primary particles having a ratio of particles each having a particle size of 1 μm or more and 1 mm or less of 90 vol % or more.

[3] The silicon carbide powder according to the above-mentioned item [1] or [2], in which the silicon carbide powder is a powder formed (i.e. made) of α-type silicon carbide, a powder formed of β-type silicon carbide, or a powder formed of a mixture of α-type silicon carbide and β-type silicon carbide.

[4] A method of producing a silicon carbide single crystal, the method including growing a silicon carbide single crystal on a silicon carbide seed crystal by a sublimation recrystallization method through use of the silicon carbide powder of any one of the above-mentioned items [1] to [3] as a raw material.

[5] The method of producing a silicon carbide single crystal according to the above-mentioned item [4], in which the growing of the silicon carbide single crystal is done (i.e. conducted) by growing the silicon carbide single crystal on the silicon carbide seed crystal provided on an undersurface of a lid (i.e. a cover put on an upper opening of a main body) of a crucible by accommodating (i.e. supplying) the silicon carbide powder in the crucible so that the silicon carbide powder has a bulk density of from 0.7 g/cm³ to 1.4 g/cm³, followed by heating.

[6] The method of producing a silicon carbide single crystal according to the above-mentioned item [4] or [5], in which the growing of the silicon carbide single crystal is done by growing the silicon carbide single crystal on the silicon carbide seed crystal provided on an undersurface of a lid of a crucible by accommodating the silicon carbide powder in the crucible so that the silicon carbide powder has a thermal conductivity of from 0.05 W/m·K to 0.15 W/m·K, followed by heating.

Advantageous Effects of Invention

The silicon carbide powder according to the present invention exhibits a high sublimation rate when used as a raw material in the production of a silicon carbide single crystal by a sublimation recrystallization method. Therefore, the growth rate of the silicon carbide single crystal, which adheres to (i.e. is formed on) a seed crystal after sublimation, is high. Thus, the cost of energy required for the production of the silicon carbide single crystal can be reduced, and the time period of the production can be shortened. In addition, the crystal can be grown even under high pressure, and hence a single crystal having a low content of impurities can be obtained because the impurities are less liable to be sublimated from the silicon carbide powder in production under high pressure.

In addition, the amount of silicon carbide remaining without being sublimated is reduced, and hence a yield can be increased.

Thus, according to the present invention, the productivity of the silicon carbide single crystal can be improved.

Further, according to the present invention, the raw material (i.e. silicon carbide powder) can maintain a state of exhibiting a high sublimation rate even when a temperature gradient between the temperature in the vicinity of the raw material (i.e. silicon carbide powder) of the silicon carbide single crystal and the temperature in the vicinity of the seed crystal provided above the raw material is small. Therefore, other crystals (i.e. undesired crystals) are less liable to be generated around the silicon carbide single crystal, and a large-sized wafer can be realized.

DESCRIPTION OF EMBODIMENTS

Figure 1:
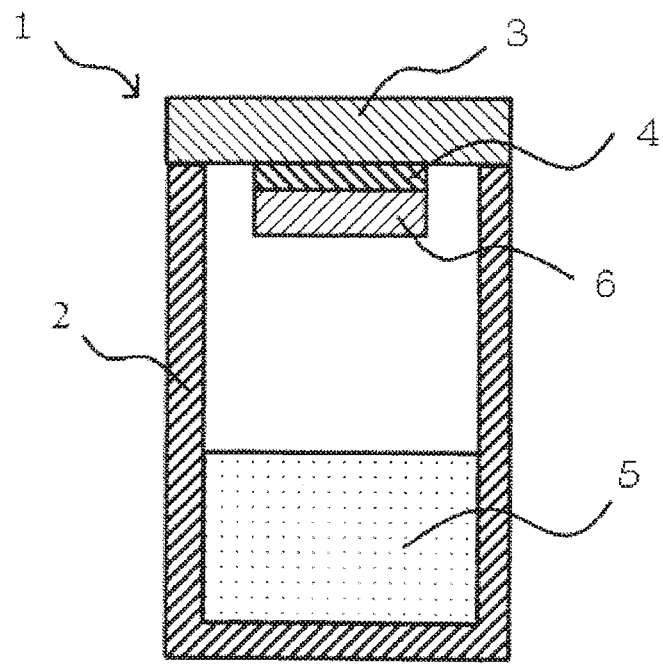
FIG. 1 is a sectional view for conceptually illustrating a crucible and its contents to be used in a sublimation recrystallization method.

A silicon carbide powder of the present invention has a Blaine specific surface area of from 250 cm$^2$/g to 1,000 cm$^2$/g, preferably from 270 cm$^2$/g to 900 cm$^2$/g, more preferably more than 300 cm$^2$/g and 800 cm$^2$/g or less, still more preferably from 400 cm$^2$/g to 700 cm$^2$/g, and particularly preferably from 500 cm$^2$/g to 600 cm$^2$/g.

When the silicon carbide powder has a Blaine specific surface area of less than 250 cm$^2$/g its reactivity lowers owing to an excessively small specific surface area, and the amount of a sublimation gas to be generated and a sublimation rate are reduced. When the silicon carbide powder has a Blaine specific surface area of more than 1,000 cm$^2$/g, the silicon carbide powder exhibits a high sublimation rate at the initial stage of its sublimation but exhibits a gradually reduced sublimation rate, and hence a stable sublimation rate cannot be maintained.

The silicon carbide powder of the present invention has such a particle size distribution that the ratio of a silicon carbide powder having a particle size (i.e. particle diameter) of more than 0.70 mm and 3.00 mm or less is 50 volt % or more with respect to the total amount of the silicon carbide powder. The ratio of the silicon carbide powder having a particle size satisfying the above-mentioned numerical range is 50 volt % or more, preferably 70 volt % or more, and more preferably 90 volt % or more. When the ratio is less than 50 volt %, the silicon carbide powder exhibits a low sublimation rate.

When the particle size is 0.70 mm or less, the silicon carbide powder has a high bulk density when loaded in a container such as a crucible. Thus, when the silicon carbide powder is sublimated, the amount of the sublimation gas to be generated is reduced owing co a narrow path for the gas to escape. As a result, the sublimation rate is reduced. In addition, the gas is liable to be accumulated in the silicon carbide powder, and hence the silicon carbide powders are sintered together as a sublimation reaction proceeds. As a result, the sublimation rate is gradually reduced, and a stable sublimation rate cannot be maintained. In addition, the amount of silicon carbide remaining without being sublimated is increased.

When the particle size is more than 3.00 mm, the silicon carbide powder has a low bulk density when loaded in a container such as a crucible. Thus, space between the particles of the silicon carbide powder is excessively large, and hence particles each have low thermal conductivity. As a result, the sublimation reaction hardly proceeds, and the sublimation rate is reduced. In addition, the amount of silicon carbide remaining without being sublimated is increased.

The phrase of "having a particle size of more than 0.70 mm and 3.00 mm or less" as used herein refers to the case where a particle of a silicon carbide powder passes through a sieve having an opening of 3.00 mm but does not pass through a sieve having an opening of 0.70 mm.

The silicon carbide powder of the present invention has the following particle size distribution: preferably such a particle size distribution that the ratio of a silicon carbide powder having a particle size of from 0.75 mm to 2.50 mm is 50 vol % or more (preferably 70 vol % or more, more preferably 90 vol % or more, still more preferably 95 vol % or more, and particularly preferably 99 vol % or more); more preferably such a particle size distribution that the ratio of a silicon carbide powder having a particle size of from 0.80 mm to 2.00 mm is 50 vol % or more (preferably 70 vol % or more, more preferably 90 volt % or more, still more preferably 95 volt % or more, and particularly preferably 99 volt % or more); particularly preferably such a particle size distribution that the ratio of a silicon carbide powder having a particle size of from 0.85 mm to 1.70 mm is 50 volt % or more (preferably 70 volt % or more, more preferably 90 volt % or more, still more preferably 95 volt % or more, and particularly preferably 99 volt % or more).

The true density (i.e. the absolute density) of the silicon carbide powder of the present invention is not particularly limited, but is generally from 2.90 g/cm$^3$ to 3.10 g/cm$^3$.

It is preferred that the silicon carbide powder of the present invention be formed of aggregated (in other words, sintered) particles of primary particles each having a particle size of 1 μm or more and 1 mm or less, and preferably from 100 μm to 800 μm. When the silicon carbide powder has such particle form, its specific surface area is increased. As a result, the silicon carbide powder exhibits a high sublimation rate in its sublimation, and such sublimation rate can be maintained for a long time period. In addition, the amount of silicon carbide remaining without being sublimated is reduced.

The ratio of the particles each having a particle size of 1 μm or more and 1 mm or less is preferably 90 volt % or more, more preferably 95 volt % or more, and particularly preferably 100 volt %, with respect to the total amount of the primary particles constituting the silicon carbide powder of the present invention.

The ratio of the particles each having a particle size of from 100 μm to 800 μm is preferably 70 volt % or more, more preferably 80 vol % or more, and particularly preferably 90 volt %, with respect to the total amount of the primary particles constituting the silicon carbide powder of the present invention.

In addition, when the silicon carbide powder has the above-mentioned form, its Blaine specific surface area can be increased (for example, 400 cm$^2$/g or more) even when the silicon carbide powder has a ratio of a silicon carbide powder having a specific particle size (for example, more than 0.70 mm and 3.00 mm or less) of 50 volt % or more.

The silicon carbide powder of the present invention may be any one of a powder formed of α-type silicon carbide, a powder formed of β-type silicon carbide, and a powder formed of a mixture of α-type silicon carbide and β-type silicon carbide.

In the silicon carbide powder of the present invention, it is preferred that the content of silicon carbide in the powder be high and the content of impurities in the powder be low.

The term of "impurities" as used herein refer to components other than silicon (Si) and carbon (C) among all elements except for oxygen (O) to be removed in a production process for the silicon carbide powder. The components as impurities correspond to unfavorable components for SiC-semiconductors. Examples thereof include boron (B), phosphorus (P), aluminum (Al), iron (Fe), titanium (Ti), copper (Cu), and nickel (Ni).

Specifically, the contents of B, P, Al, Fe, Ti, Cu, and Ni in the silicon carbide powder are each preferably 3 ppm or less, more preferably 1.5 ppm, or less, and still more preferably 1.0 ppm or less. Of those, the contents of B and P are each even still more preferably 0.3 ppm or less.

The content of oxygen (O) in the silicon carbide powder is preferably less than 0.5 mass %. The term of "content of oxygen (O)" refers to the total content of oxygen atoms constituting metal oxides contained in the silicon carbide powder.

When the contents of B, P, Al, Fe, Ti, Cu, and Ni in the silicon carbide powder are each set within the above-mentioned range, a silicon carbide single crystal having a higher purity can be obtained when the silicon carbide single crystal is produced by a sublimation recrystallization method using the silicon carbide powder as a raw material.

The total content of the impurities in the silicon carbide powder is preferably 500 ppm or less, more preferably 200 ppm or less, and particularly preferably 100 ppm or less. When the total content is 500 ppm or less, a silicon carbide single crystal having a higher purity can be obtained when the silicon carbide single crystal is produced by a sublimation recrystallization method using the silicon carbide powder as a raw material.

The term of "ppm" as used herein is based on mass (i.e. weight).

The content (i.e. the degree of purity) of silicon carbide in the silicon carbide powder is preferably 99.0 mass % or more, more preferably 99.5 mass % or more, still more preferably 99.9 mass % or more, and particularly preferably 99.99 mass % or more, in terms of a ratio with respect to 100 mass % of the silicon carbide powder.

As a method of producing the silicon carbide powder of the present invention, there is given a method involving heating, with an Acheson furnace, a raw material for producing silicon carbide prepared by mixing a siliceous raw material and a carbonaceous raw material.

The mixture mole ratio ($C/SiO_2$) between the carbonaceous raw material and the siliceous raw material in the raw material for producing silicon carbide is preferably from 2.5 to 4.0, more preferably from 2.8 to 3.6, and particularly preferably from 3.0 to 3.3.

The mixture mole ratio affects the composition of the silicon carbide powder. For example, the case where the mixture mole ratio is less than 2.5 or more than 4.0 is not preferred, because a large amount of the siliceous raw material or the carbonaceous raw material remains unreacted in the silicon carbide powder.

The phrase of "mixture mole ratio between the carbonaceous raw material and the siliceous raw material" as used herein refers to the ratio between the molar amount of carbon (C) in the carbonaceous raw material and the molar amount of silicic acid ($SiO_2$) in the siliceous raw material, which is represented as the ratio of ($C/SiO_2$) in the preparation of the raw material for producing silicon carbide through mixing of the carbonaceous raw material and the siliceous raw material.

As the raw material for producing silicon carbide, a raw material obtained by pelletizing in advance a mixed raw material obtained by mixing the siliceous raw material in a powder form and the carbonaceous raw material in a powder form may be used. As the pelletized raw material for producing silicon carbide, there is given, for example, a raw material obtained by pelletizing a mixture of silica and an organic resin.

Examples of the siliceous raw material to be used in the method of producing the silicon carbide powder include: crystalline silica such as natural silica sand, natural silica stone powder, artificial silica stone powder, and the like; and non-crystalline silica such as silica fume, silica gel, and the like. One kind thereof may be used alone, or two or more kinds thereof may be used in combination. Of those, non-crystalline silica is preferred from the viewpoint of reactivity.

The siliceous raw material has an average particle diameter of preferably 3 mm or less, more preferably 2 mm or less, still more preferably 1 mm or less, and particularly preferably 800 μm or less. When the siliceous raw material has an average particle diameter of more than 3 mm, its reactivity significantly lowers, resulting in lower productivity.

The term of "average particle diameter" as used herein refers to an arithmetic average value of particle diameters (i.e. particle sizes). The average particle diameter may be calculated by, for example, measuring an appropriate number of particles (for example, 100 particles) for their particle diameters, and then dividing the total of the particle diameters by the number of the particles measured.

Examples of the carbonaceous raw material to be used in the production method of the silicon carbide powder include petroleum coke, coal pitch, carbon black, and various organic resins. One kind thereof may be used alone, or two or more kinds thereof may be used in combination. Of those, carbon black is preferred from the viewpoints of purity and particle size.

The carbonaceous raw material has an average particle diameter of preferably from 1 nm to 500 μm, more preferably from 5 nm to 100 μm, still more preferably from 10 nm to 10 μm, even still more preferably from 20 nm to 1 μm, yet even still more preferably from 30 nm to 500 nm, and particularly preferably from 50 nm to 300 nm, from the viewpoint of its reactivity with the siliceous raw material. In the case where the carbonaceous raw material includes primary particles and secondary particles (for example, in the case where the carbonaceous raw material is carbon black), the average particle diameter of the carbonaceous raw material in this case refers to the average particle diameter of the primary particles.

As another example of the raw material for producing silicon carbide to be used in the production method of the silicon carbide powder, there is given a powder in which each particle of the powder is prepared so as to have carbon and silicic acid distributed in its entirety and have a mixture mole ratio between carbon and silicic acid ($C/SiO_2$) of preferably from 2.3 to 4.0, more preferably from 2.8 to 3.6, and particularly preferably from 2.9 to 3.3.

The kind of a heating element (i.e. a heat generator) of the Acheson furnace to be used in the production method of the silicon carbide powder is not particularly limited as long as the heating element can conduct electricity. Examples of the heating element, include graphite powder and a carbon rod. It is preferred that the content of impurities except for carbon (i.e. the total content of B, P, and the like) in the heating element be lower than the content of the impurities in the raw material for producing silicon carbide described above.

The heating element may have any form of a powder form and a rod form as long as the heating element can conduct electricity. In the case of a rod form, the form of a rod body is not particularly limited, and may be any of a cylindrical shape and a rectangular column shape.

The silicon carbide powder of the present invention may be obtained by heating, with the Acheson furnace, the above-mentioned raw material for producing silicon carbide, followed by pulverization.

The use of the Acheson furnace permits inexpensive mass production of the silicon carbide powder safely as compared to the case of using another electric furnace or the like.

A general Acheson furnace (for example, a furnace of a type open to the atmosphere with a furnace main body having an approximately U-shaped cross section) may be used as the Acheson furnace.

When the heating element of the Acheson furnace is heated through application of a current, a direct reduction reaction represented by the following formula (1) occurs around the heating element, to produce massive silicon carbide (SiC).

$$SiO_2 + 3C \rightarrow SiC + 2CO \qquad (1)$$

The temperature of the reaction is set to preferably from 1,600° C. to 3,000° C., and more preferably from 1,600° C. to 2,500° C.

The silicon carbide powder of the present invention may be obtained by pulverizing the resultant massive silicon carbide (i.e. the silicon carbide lump) with a ball mill or the like until a predetermined particle size is achieved, followed by classification with a sieve.

A silicon carbide powder having a low content of impurities (i.e. B, P, and the like) can be obtained as compared to the case of using another electric furnace, because the Acheson furnace is a large furnace and allows the reaction to occur under a non-oxidizing atmosphere. The silicon carbide powder having a low content of impurities is suitable as a raw material of a single crystal used for a power semiconductor or the like.

Each of the particles of the silicon carbide powder produced by the above-mentioned production method is generally formed of aggregated particles of a plurality of primary particles, in which a plurality of primary particles have a ratio of particles each having a particle size of 1 μm or more and 1 mm or less of 90 volt % or more. Therefore, the silicon carbide powder can be increased in Blaine specific surface area in spite of having a specific particle size.

The true density of the silicon carbide powder is generally from 2.90 g/cm$^3$ to 3.10 g/cm$^3$.

When the silicon carbide powder of the present invention is used as a raw material in a sublimation recrystallization method (i.e. modified Lely method), a silicon carbide single crystal can be obtained easily. One embodiment of the sublimation recrystallization method is explained with reference to FIG. 1 below.

A single crystal plate, in which a Si surface is exposed through polishing, is provided as a silicon carbide seed crystal 4 on the inner surface (i.e. the undersurface) of a lid 3 of a crucible 1 including a main body 2 and the lid 3. Meanwhile, a silicon carbide powder 5 of the present invention (i.e. a raw material of a single crystal) is accommodated in the crucible 1 so as to have a bulk density of preferably from 0.7 g/cm$^3$ to 1.4 g/cm$^3$, more preferably from 0.8 g/cm$^3$ to 1.3 g/cm$^3$, still more preferably from 0.9 g/cm$^3$ to 1.2 g/cm$^3$, and particularly preferably from 1.0 g/cm$^3$ to 1.1 q/cm$^3$. After that, the silicon carbide powder 5 is heated to be sublimated. Thus, a silicon carbide single crystal 6 can be grown on the seed crystal 4.

When the silicon carbide powder 5 has a bulk density of 0.7 g/cm$^3$ or more, the space between the particles of the silicon carbide powder 5 is small, and hence heat is sufficiently conducted, with the result that the sublimation rate of the silicon carbide powder 5 can be more increased. When the silicon carbide powder 5 has a bulk density of 1.4 g/cm$^3$ or less, the silicon carbide powder 5 is prevented from being excessively densified, and hence a sublimation gas generated easily escapes from the inside of the silicon carbide powder 5, with the result that the growth rate of the silicon carbide single crystal 6 can be more increased.

The heating temperature of the silicon carbide powder 5 is preferably from 2,000° C. to 5,000° C., more preferably from 2,200° C. to 4,000° C., and particularly preferably from 2,300° C. to 3,000° C. When the heating temperature is 2,000° C. or more, the silicon carbide powder 5 is more easily sublimated. When the heating temperature is 5,000° C. or less, such a temperature is advantageous in terms of energy cost.

An example of the crucible 1 is a crucible made of graphite.

The silicon carbide powder 5 accommodated in the crucible 1 has a thermal conductivity of preferably from 0.05 W/m·K to 0.15 W/m·K, more preferably from 0.06 W/m·K to 0.1.2 W/m·K, and particularly preferably from 0.07 W/m·K to 0.10 W/m·K. When the silicon carbide powder has a thermal conductivity of 0.05 W/m·K or more, heat is easily conducted to the silicon carbide powder, resulting in more improved productivity. When the silicon carbide powder has a thermal conductivity of 0.15 W/m·K or less, heat release is suppressed, and heat energy to be required can be reduced.

The thermal conductivity may be measured by a heat penetration method using a thermal conductivity measurement device (manufactured by Rigaku Corporation, trade name "thermal conductivity measurement device TCi").

The silicon carbide powder of the present invention exhibits a high sublimation rate in its heating, and hence when the silicon carbide powder is used as a raw material in the sublimation recrystallization method, the growth rate of the silicon carbide single crystal on the seed crystal can be increased. Thus, the cost of energy for producing the silicon carbide single crystal can be reduced. In addition, the time period required for obtaining the target silicon carbide single crystal can be shortened by virtue of the increased growth rate of the silicon carbide single crystal, and hence the productivity can be improved. In addition, the silicon carbide single crystal can be grown even under high pressure, and hence it is easy to facilitate the control of the impurities (in other words, the application of high pressure prevents the impurities from being mixed at the time of the reaction).

In addition, a high sublimation rate can be maintained even when a temperature gradient is small in the sublimation recrystallization method. Therefore, other crystals (i.e. undesired crystals) are less liable to be generated around the silicon carbide single crystal, and a large-sized wafer can be realized.

Further, the silicon carbide powder of the present invention has a low bulk density, and space between the particles of the powder is large. Therefore, the sublimation gas generated is not accumulated in the inside of the silicon carbide powder, and densification resulting from recrystallization on of the sublimation gas in the inside of the silicon carbide powder can be prevented. Thus, the amount of silicon carbide remaining without being sublimated is reduced. Consequently, a yield can be increased.

EXAMPLES

Now, the present invention is described in more detail by way of Examples. However, the present invention is not limited to Examples.

[Raw Materials to be Used]

(1) Siliceous Raw Material (Raw Material of Silicon Carbide Powder B)

High-purity silica (silica gel, which is non-crystalline silica); content of silica (absolute dry state): 99.99 mass % or more; content of impurities except for oxygen atoms: 10 ppm or less; average particle diameter: 600 μm; manufactured by Taiheiyo Cement Corporation (2) Carbonaceous Raw Material (Raw Material of Silicon Carbide Powder B)

Carbon black (manufactured by Tokai Carbon Co., Ltd.; trade name "SEAST TA"; average particle diameter: 122 nm)

(3) Heating Element (for Production of Silicon Carbide Powder B)

Graphite powder for a heating element (trial product manufactured by Taiheiyo Cement Corporation: graphite powder obtained by subjecting carbon black to heat treatment at 3,000° C.)

(4) Silicon Carbide Powder (Material of Silicon Carbide Powders A and C)

Silicon carbide powder for polishing (manufactured by Yakushima Denko Co., Ltd.; trade name "GC"; content of impurities except for oxygen atoms: 495 ppm; content of silicon carbide: 99.5 mass %; kind of silicon carbide: α-type)

[Analysis Method]

(1) Blaine Specific Surface Area

Blaine specific surface area was measured in conformity to "JIS R 5201".

(2) True Density

True density was measured by a pycnometer method (gas substitution) using "Accupyc 1330" (trade name) manufactured by Shimadzu Corporation.

(3) Contents of B (Boron) and P (Phosphorus)

Contents of B (boron) and P (phosphorus) were measured based on ICP-AES analysis using an alkali fusion method, which was an analysis method for B (boron) in soil (see. Bunseki Kagaku Vol. 47, No. 7, pp. 451-454).

Specifically, 1 g of a sample and 4 g of $Na_2CO_3$ were loaded in a platinum crucible, and then the platinum crucible was placed in an electric furnace and heated at 700° C. for 1 hour. Next, the mixture in the platinum crucible was heated at 800° C. for 4 hours while being stirred every one hour, and further heated at 1,000° C. for 15 minutes. 20 ml of 50 mass % HCl was added to the mixture (i.e. fused material) after the heating, and the fused material was dissolved at 140° C. for 10 minutes by using a hot plate while being crushed. The resultant was diluted to 100 ml through addition of water, followed by filtration. The ICP-AES analysis was performed on the resultant solid content (i.e. solid substance)

(4) Contents of Elements (Al, Fe, Ti, Cu, and Ni) Except for B and P

Contents (ppm) of elements except for B and P were measured based on ICP-AES analysis using a pressure acid decomposition method described in "JIS R 1616".

(5) Content of Oxygen (O)

Content (mass %; % by weight) of oxygen (O) was measured by using "TCH-600" manufactured by LECO.

(6) Thermal Conductivity

Thermal conductivity was measured by using a heat penetration method using a thermal conductivity measurement device (manufactured by Rigaku Corporation, trade name "thermal conductivity measurement device TCi").

[Production of Silicon Carbide Powder A]

The silicon carbide powder for polishing described in the item (4) of "Raw Materials to be Used" section was pulverized with a ball mill to yield a silicon carbide powder A having a particle size, a Blaine specific surface area, and a true density shown in Table 1. The ratio of a silicon carbide powder having a particle size of from 0.85 mm to 1.70 mm was 99 vol % or more.

The silicon carbide powder A does not have a particle form in which primary particles are aggregated, unlike a silicon carbide powder B described below.

[Production of Silicon Carbide Powder B]

The high-purity silica and carbon black described in the items (1) and (2) of "Raw Materials to be Used" section were mixed with a biaxial mixer so that the molar ratio between carbon and silicic acid ($C/SiO_2$) was 3.0, to yield 160 kg of a raw material for producing silicon carbide. The resultant raw material for producing silicon carbide and the graphite powder for a heating element described in the item (3) of "Raw Materials to be Used" section were accommodated in an Acheson furnace (inner dimensions of the Acheson furnace: 1,000 mm in length, 500 mm in width, and 500 mm in height), and then heating was performed at about 2,500° C. for about 10 hours through application of a current. Thus, 20.0 kg of massive silicon carbide was produced.

The resultant massive silicon carbide was pulverized with a ball mill. After the pulverization, the pulverized product of silicon carbide was classified with a sieve. Thus, a silicon carbide powder B shown in Table 1 (kind of silicon carbide: mixture of α-type and β-type) having a ratio of a silicon carbide powder having a particle size of from 0.85 mm to 1.70 mm of 99 vol % or more was obtained.

Figure 2:
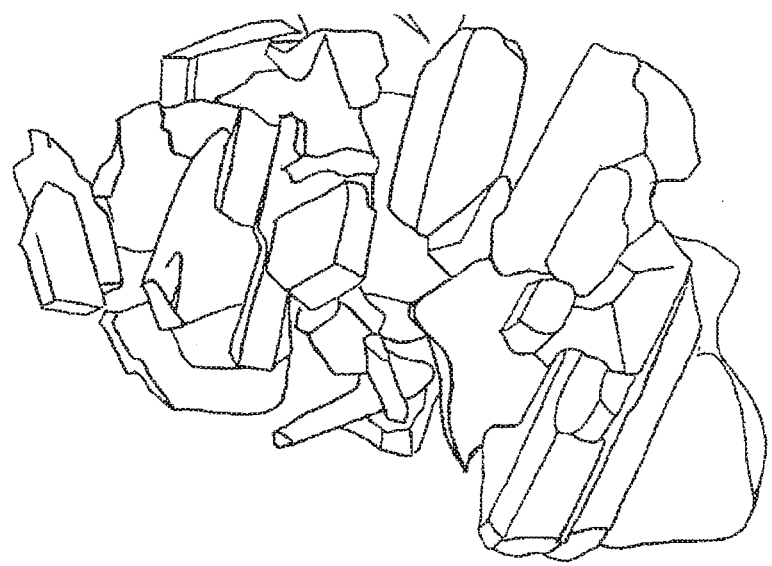
FIG. 2 is a view for simply illustrating the photograph of a silicon carbide powder B.

The silicon carbide powder B was observed with a scanning electron microscope, and as a result, it was found that the silicon carbide powder B had a particle form in which various primary particles each having a particle diameter of 1 μm or more and 1 mm or less were aggregated. A view for simply illustrating the photograph of the silicon carbide powder B is illustrated in FIG. 2.

The ratio of the particles each having a particle size of 1 µm or more and 1 mm or less with respect to the total amount of the primary particles constituting the silicon carbide powder was 100 vol %. In addition, the ratio of particles each having a particle size of from 100 µm to 800 µm with respect to the total amount of the primary particles constituting the silicon carbide powder was 90 vol % or more.

In addition, the contents of impurities (B, P, Al, Fe, Ti, Cu, Ni, and O) in the silicon carbide powder were each measured by the above-mentioned analysis method. The results are shown in Table 2.

The contents of impurities (except for oxygen atoms) in the silicon carbide powder were each 100 ppm or less. The content (i.e. the degree of purity) of silicon carbide in the silicon carbide powder was 99.99 mass % or more.

[Production of Silicon Carbide Powder C]

The silicon carbide powder for polishing described in the item (4) of "Raw Materials to be Used" section was pulverized with a ball mill to yield a silicon carbide powder C having a particle size, a Blaine specific surface area, and a true density shown in Table 1. The ratio of a silicon carbide powder having a particle size of from 0.05 mm to 0.70 mm was 99 vol % or more.

TABLE 1

| Kind of silicon carbide powder | Particle size (lower limit to upper limit) (mm) | Blaine specific surface area (cm²/g) | True density (g/cm³) |
| --- | --- | --- | --- |
| Silicon carbide powder A | 0.85 to 1.70 | 280 | 3.05 |
| Silicon carbide powder B | 0.85 to 1.70 | 540 | 3.02 |
| Silicon carbide powder C | 0.05 to 0.70 | 220 | 3.18 |

TABLE 2

| | B | P | Al | Fe | Ti | Cu | Ni | O |
| --- | --- | --- | --- | --- | --- | --- | --- | --- |
| | | | | (ppm) | | | | (mass %) |
| Silicon carbide powder B | <0.1 | <0.1 | <0.1 | <0.1 | 1.0 | <0.4 | <0.4 | 0.32 |

Example 1

1,140 g of the "silicon carbide powder A" was loaded in a crucible made of graphite. In addition, a single crystal plate in which a Si surface was exposed through polishing was provided as a seed crystal on the undersurface of a lid of the crucible made of graphite. The silicon carbide powder A in the crucible had a bulk density of 1.26 g/cm³. In addition, the silicon carbide powder A in the crucible was measured for thermal conductivity by the above-mentioned analysis method.

The crucible made of graphite was heated at 2,300° C. under a pressure of 1 Torr, to sublimate the silicon carbide powder A in the crucible. Thus, a silicon carbide single crystal was grown on the seed crystal. The heating was performed until the thickness of the silicon carbide single crystal grown on the seed crystal reached 13 mm. The time period required for the thickness of the silicon carbide single crystal to reach 13 mm was 63 hours. After the completion of the reaction, the mass (i.e. residual amount) of the remaining silicon carbide powder was measured to be 772 g. From the measurement result, it was revealed that 67.7% of the loaded amount remained.

The sublimation rate of the silicon carbide powder and the growth rate of the silicon carbide single crystal were calculated based on the time period (63 hours) and the amount of the remaining silicon carbide powder (772 g). The results are shown in Table 3.

Example 2

A silicon carbide single crystal was obtained in the same manner as in Example 1 except that 935 g of the "silicon carbide powder B" was used instead of the silicon carbide powder A. The results are shown in Table 3.

Comparative Example 1

A silicon carbide single crystal was obtained in the same manner as in Example 1 except that 1,400 g of the "silicon carbide powder C" was used instead of the silicon carbide powder A. The results are shown in Table 3.

TABLE 3

| | Loaded amount (g) | Bulk density (g/cm³) | Thermal conductivity (W/m · K) | Sublimation rate (g/hour) | Growth rate (µm/hour) | Time period of single crystal growth (hour) | Residual amount (g) | Residual rate (%) |
| --- | --- | --- | --- | --- | --- | --- | --- | --- |
| Example 1 | 1,140 | 1.26 | 0.105 | 5.83 | 208 | 63 | 772 | 67.7 |
| Example 2 | 935 | 1.04 | 0.079 | 6.83 | 245 | 53 | 573 | 61.3 |
| Comparative Example 1 | 1,400 | 1.55 | 0.160 | 4.70 | 168 | 77 | 1,038 | 74.1 |

From Table 3, it is revealed that, in the case of using the silicon carbide powder of the present invention (i.e. Examples 1 and 2), the growth rate of the silicon carbide single crystal is high and the amount of the silicon carbide powder remaining without being sublimated after the completion of the reaction is small, as compared to the case of using a silicon carbide powder not corresponding to the present invention (i.e. Comparative Example 1).

REFERENCE SIGNS LIST 1 crucible
2 main body
3 lid (i.e. top lid, or upper lid)
4 silicon carbide seed crystal
5 silicon carbide powder (i.e. raw material of single crystal)
6 silicon carbide single crystal

The invention claimed is:

1. A method of producing a silicon carbide single crystal, the method comprising:
   heating a raw material for producing silicon carbide with an Acheson furnace to obtain a massive silicon carbide;
   pulverizing the massive silicon carbide, followed by separation, to obtain a silicon carbide powder that has a Blaine specific surface area of from 250 cm$^2$/g to 1,000 cm$^2$/g, that has a ratio of a silicon carbide powder having a particle size of from 0.85 mm to 1.70 mm of 90 vol % or more with respect to a total amount of the silicon carbide powder, and that comprises aggregated particles of primary particles having a ratio of particles each having a particle size of 1 μm or more and 1 mm or less of 90 vol % or more; and
   growing a silicon carbide single crystal on a silicon carbide seed crystal by a sublimation recrystallization method through use of the silicon carbide powder as a raw material.

2. The method of producing a silicon carbide single crystal according to claim 1, wherein the silicon carbide powder is a powder formed of a mixture of α-type silicon carbide and β-type silicon carbide.

3. The method of producing a silicon carbide single crystal according to claim 1, wherein the growing of the silicon carbide single crystal is done by growing the silicon carbide single crystal on the silicon carbide seed crystal provided on an undersurface of a lid of a crucible by accommodating the silicon carbide powder in the crucible so that the silicon carbide powder has a bulk density of from 0.7 g/cm$^3$ to 1.4 g/cm$^3$, followed by heating.

4. The method of producing a silicon carbide single crystal according to claim 1, wherein the growing of the silicon carbide single crystal is done by growing the silicon carbide single crystal on the silicon carbide seed crystal provided on an undersurface of a lid of a crucible by accommodating the silicon carbide powder in the crucible so that the silicon carbide powder has a thermal conductivity of from 0.05 W/m·K to 0.15 W/m·K, followed by heating.

5. The method of producing a silicon carbide single crystal according to claim 3, wherein the growing of the silicon carbide single crystal is done by growing the silicon carbide single crystal on the silicon carbide seed crystal provided on an undersurface of a lid of a crucible by accommodating the silicon carbide powder in the crucible so that the silicon carbide powder has a thermal conductivity of from 0.05 W/m·K to 0.15 W/m·K, followed by heating.

6. The method of producing a silicon carbide single crystal according to claim 1, wherein the pulverization of the massive silicon carbide is done with a ball mill, and the separation is done with a sieve.

7. The method of producing a silicon carbide single crystal according to claim 1, wherein the raw material for producing silicon carbide is prepared by mixing a siliceous raw material and a carbonaceous raw material so that the mixture mole ratio (C/SiO$_2$) between the carbonaceous raw material and the siliceous raw material in the raw material for producing silicon carbide is from 2.5 to 4.0.

8. The method of producing a silicon carbide single crystal according to claim 7, wherein
   the siliceous raw material is a non-crystalline silica, and
   the carbonaceous raw material is a carbon black.

9. The method of producing a silicon carbide single crystal according to claim 8, wherein the non-crystalline silica is a silica gel having an average particle diameter of 3 mm or less, and the carbon black is a carbon black having an average particle diameter of from 30 nm to 500 nm.

10. The method of producing a silicon carbide single crystal according to claim 1, wherein
    the massive silicon carbide obtained in the heating of the raw material for producing silicon carbide with an Acheson furnace is a silicon carbide lump.

* * * * *